(12) United States Patent
Yang et al.

(10) Patent No.: US 10,773,993 B2
(45) Date of Patent: Sep. 15, 2020

(54) COVER GLASS OF DISPLAY PANEL AND A MANUFACTURING METHOD THEREOF

(71) Applicant: Wuhan China Star Optoelectronics Technology Co., Ltd., Wuhan, Hubei (CN)

(72) Inventors: Yong Yang, Hubei (CN); Yingbao Yang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 276 days.

(21) Appl. No.: 15/578,985

(22) PCT Filed: Nov. 14, 2017

(86) PCT No.: PCT/CN2017/110822
§ 371 (c)(1),
(2) Date: Dec. 1, 2017

(87) PCT Pub. No.: WO2019/085010
PCT Pub. Date: May 9, 2019

(65) Prior Publication Data
US 2019/0382305 A1  Dec. 19, 2019

(30) Foreign Application Priority Data
Oct. 31, 2017  (CN) .......................... 2017 1 1053823

(51) Int. Cl.
*C03C 15/00* (2006.01)
*G02B 1/11* (2015.01)
(Continued)

(52) U.S. Cl.
CPC ................ *C03C 15/00* (2013.01); *G02B 1/11* (2013.01); *G03F 7/2043* (2013.01); *H05K 5/0017* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 4,764,441 A | * | 8/1988 | Ohta | .......................... G03F 1/38 |
| | | | | 216/24 |
| 5,346,583 A | * | 9/1994 | Basavanhally | ........ G02B 6/322 |
| | | | | 156/273.3 |

(Continued)

FOREIGN PATENT DOCUMENTS

| | | |
|---|---|---|
| CN | 102858705 | 1/2013 |
| CN | 106896555 | 6/2017 |

(Continued)

*Primary Examiner* — Shamim Ahmed
(74) *Attorney, Agent, or Firm* — Hemisphere Law, PLLC; Zhigang Ma

(57) ABSTRACT

A cover glass and a manufacturing method thereof are provided, the method includes: coating a first organic layer on a transparent substrate; forming first via holes on the first organic layer at intervals, heating and melting the first organic layer to flow; wet-etching the transparent substrate having the first organic layer to form a first microstructure on a region of the transparent substrate not shielded by the first organic layer; and removing the first organic layer form the transparent substrate. The present disclosure breaks the limitation for preparing microstructures with size below 5 μm in the existing photolithography process, the organic material in wet-etching process can be controlled by heating to make the organic material melted to flow. The size of the microstructure can be reduced and flexibly adjusted accord- (Continued)

ing to the pixel size of display panel, the speckle effect of the display device caused by anti-glare treatment can be reduced.

7 Claims, 2 Drawing Sheets

(51) Int. Cl.
  *G03F 7/20* (2006.01)
  *H05K 5/00* (2006.01)
  *H05K 5/03* (2006.01)

(56) References Cited

U.S. PATENT DOCUMENTS

| | | | | |
|---|---|---|---|---|
| 7,276,181 B2* | 10/2007 | Miwa | ............ | C03C 15/00 |
| | | | | 216/109 |
| 8,771,532 B2* | 7/2014 | Carlson | ............ | C03C 15/00 |
| | | | | 216/28 |
| 2011/0267697 A1* | 11/2011 | Kohli | ............ | C03C 15/00 |
| | | | | 359/609 |
| 2013/0107370 A1* | 5/2013 | Lander | ............ | C03C 15/00 |
| | | | | 359/609 |
| 2014/0295145 A1* | 10/2014 | Mizuno | ............ | B32B 3/263 |
| | | | | 428/172 |
| 2015/0331149 A1 | 11/2015 | Bookbinder et al. | | |
| 2016/0313494 A1* | 10/2016 | Hamilton | ............ | G02B 6/0036 |

FOREIGN PATENT DOCUMENTS

| | | |
|---|---|---|
| CN | 107102386 | 8/2017 |
| CN | 107217262 | 9/2017 |

* cited by examiner

COVER GLASS OF DISPLAY PANEL AND A MANUFACTURING METHOD THEREOF

RELATED APPLICATIONS

The present application is a National Phase of International Application Number PCT/CN2017/110822, filed Nov. 14, 2017, and claims the priority of China Application No. 201711053823.0 filed Oct. 31, 2017.

BACKGROUND OF THE INVENTION

1. Field of the Invention

The present invention relates to display technology, and more particularly, to a cover glass of display device and a manufacturing method thereof.

2. The Related Arts

Mobile phone consumers often suffer from ambient light in using mobile phones in a bright environment. In order to solve this problem, currently, the commonly used method is to perform surface treatment on the mobile phone cover and increase the diffusion of the phone cover surface to achieve an anti-glare effect. However, the anti-glare surface treatment will cause sparkle phenomenon when the cover glass to the module, which may affect the viewing comfort. Studies have shown that the severity of sparkle correlates with the size of the microstructure on the cover surface, and the smaller the microstructure relative to a single subpixel, the less sparkle. With the improvement of the panel resolution of mobile phones, the size of sub-pixels is getting smaller and smaller. According to the existing process conditions, the traditional wet etching process cannot meet the requirements of the size of the microstructure. Therefore, it is necessary to propose a new cover treatment process to overcome the technical problems.

SUMMARY

In view of the shortcomings of the prior arts, the present disclosure provides a cover glass of display device and a method of manufacturing the same, which not only can achieve the anti-glare effect, but also can improve the speckle phenomenon on the surface of the cover glass.

In order to achieve the above objectives, the present disclosure adopts the following technical solutions.

A method of manufacturing a cover glass, comprises:

providing a transparent substrate, and coating a first organic material layer on a top surface of the transparent substrate;

forming first via holes on the first organic material layer at intervals;

heating the first organic material layer, and melting the first organic material layer to flow;

wet-etching the surface of the transparent substrate provided with the first organic material layer, and forming a recessed first microstructure on a region of the transparent substrate not shielded by the first organic material layer;

rinsing the transparent substrate and removing the first organic material layer from the surface of the transparent substrate.

As one embodiment, the method of manufacturing the cover glass further comprises: rinsing the transparent substrate before coating the first organic material layer.

As one embodiment, the step of forming first via holes on the first organic material layer at intervals comprises:

coating a first photoresist layer on a surface of the first organic material layer, the photoresist layer adopting a positive photoresist material;

disposing a first photomask over the first photoresist layer, a first light-transmitting hole being provided on the first photomask;

exposing the first photoresist layer through the first light-transmitting hole, and then etching the organic material facing the first light-transmitting hole after development to obtain the first organic material layer with the first via hole provided on its surface.

As one embodiment, a size of the first light-transmitting hole is 1 µm~3 µm, a size of the first via hole is 1 µm~5 µm.

As one embodiment, the first light-transmitting hole is a horn-shaped hole, and the size of the first light-transmitting layer is smaller close to the first organic material layer.

As one embodiment, a material of the first organic material is polystyrene, polyethylene terephthalate, polyethylene or polypropylene.

As one embodiment, the method of manufacturing the cover glass further comprises: forming a recessed second microstructure on the surface of the transparent substrate having the first microstructure, the second microstructure being offset from the first microstructure by a certain distance.

As one embodiment, the step of forming the second microstructure comprises:

coating a second organic material layer on the surface of the transparent substrate having the first microstructure;

forming second via holes on the second organic material layer at intervals, a projection of the second via hole on the transparent substrate being offset from the first microstructure by a certain distance;

heating the second organic material layer, and melting the second organic material layer to flow;

wet-etching the surface of the transparent substrate provided with the second organic material layer, and forming the second microstructure on a region of the transparent substrate not shielded by the second organic material layer;

rinsing the transparent substrate and removing the second organic material layer from the surface of the transparent substrate.

As one embodiment, forming second via holes on the second organic material layer at intervals, comprises:

coating a second photoresist on a surface of the second organic material layer, the second photoresist layer adopting a positive photoresist material;

disposing a second photomask over the second photoresist layer, a second light-transmitting hole provided on the second photomask, a projection of the second light-transmitting hole on the transparent substrate being offset from the first microstructure; and exposing the second photoresist layer through the second light-transmitting hole, and then etching the organic material facing the second light-transmitting hole after development to obtain the second organic material layer with the second via hole provided on its surface.

Another objective of the present disclosure is to provide a cover glass of display device, which adopting the above described manufacturing method.

The present disclosure breaks through the limit of the microstructure prepared by the existing photolithography process, so that the microstructure size can be controlled below 5 µm, and the organic material in wet-etching process can be controlled by heating to make the organic material melted to flow. Such that, the size of the microstructure on the surface of the cover glass can be further reduced, the size of the microstructure of the cover glass can be flexibly adjusted according to the pixel size in the display panel. Therefore, to reduce the speckle effect on the image quality of the display device caused by the anti-glare treatment on the surface of the cover glass.

DETAILED DESCRIPTION OF THE PREFERRED EMBODIMENTS

Figure 1:
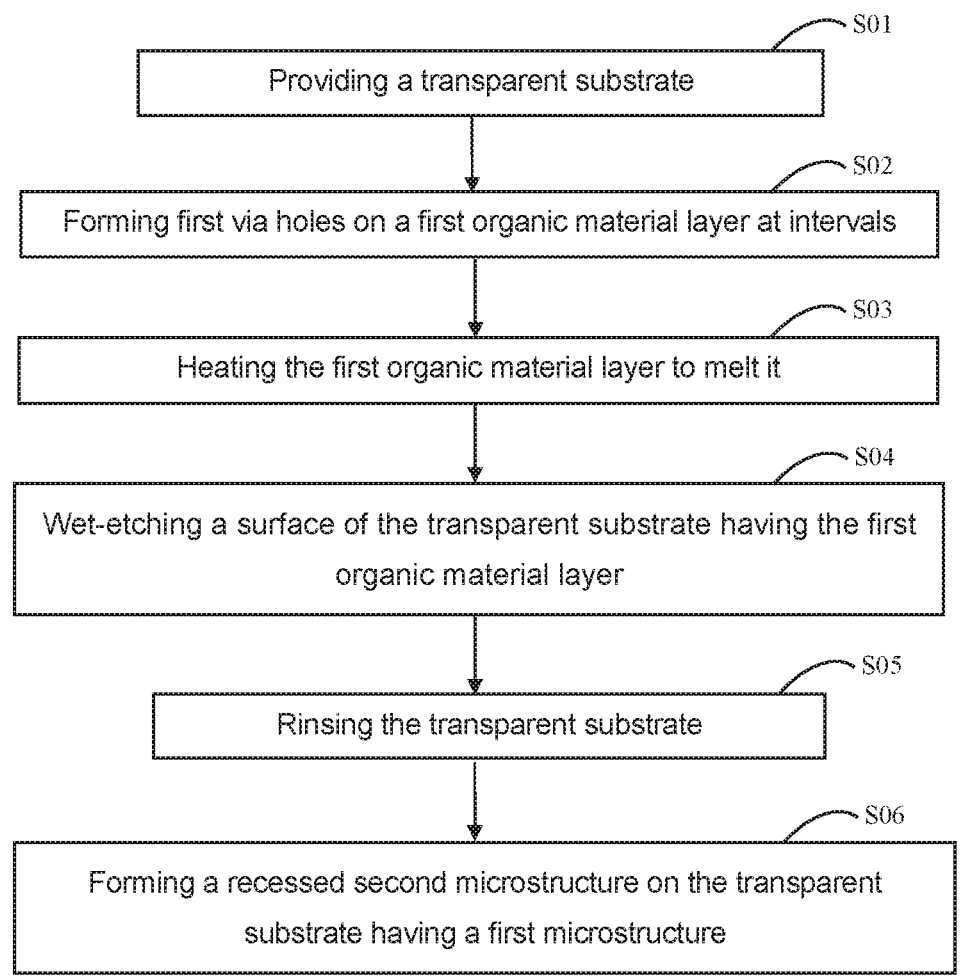
FIG. 1 is schematic flow chart of a manufacturing method for a cover glass according to one embodiment of the present disclosure.

In the description of the disclosure, terms such as "above", "below", "left", "right", "vertical", "horizontal", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure.

Moreover, the above terms may be used to indicate other meanings besides the position or the position relation. For example, the term "upper" may also be used to indicate some kind of attachment or connection in some cases. For those skilled in the art, the specific meanings of these terms in the present invention may be understood as the case may be.

In order to understand the above objectives, features and advantages of the present disclosure more clearly, the present disclosure is described in detail below with references to the accompanying drawings and specific embodiments. It should be noted that, the disclosure can be embodied in many forms of substitution, and should not be interpreted as merely limited to the embodiments described herein.

Figure 2:
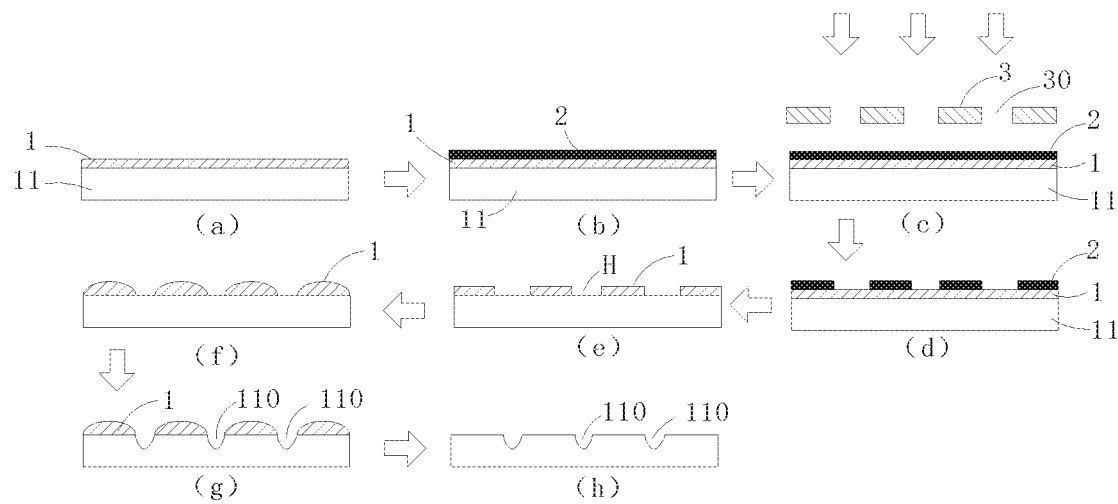
FIG. 2 is schematic diagram showing one part of the manufacturing method for a cover glass according to one embodiment of the present disclosure.

Referring FIGS. 1 and 2, the method of manufacturing a cover glass is mainly comprising:

S01, providing a transparent substrate 11, and coating a first organic material layer 1 (as shown in FIG. 2(a)) on a top surface of the transparent substrate 11.

The transparent substrate 11 can be a glass substrate. Before coating the first organic material layer 1 on the top surface of the transparent substrate 11, the transparent substrate 11 is also cleaned beforehand. The cleaning liquid used for the cleaning can be aqueous ammonia to remove the dust, particles or other impurities on the surface of the transparent substrate 11, so as to ensure that the surface of the transparent substrate 11 has a high degree of cleanliness, and also to remove static electricity on the surface.

S02, forming first via holes H on the first organic material layer 1 at intervals.

The manufacturing step can be implemented by a photolithography process, which specifically includes:

coating a first photoresist layer 2 on the surface of the first organic material layer (as shown in FIG. 2(b)), the first photoresist layer 2 adopting a positive photoresist material;

disposing a first photomask 3 over the first photoresist layer 2, a first light-transmitting hole 30 provided on the first photomask 3 (as shown in FIG. 2(c));

exposing the first photoresist layer 2 through the first light-transmitting hole 30, and then etching the organic material facing the first light-transmitting hole 30 after development to obtain the first organic material layer 1 with the first via hole H provided on its surface (as shown in FIGS. 2(d) and (e)).

Herein, a pore diameter of the first light-transmitting hole 30 of the photomask dl is 1 μm~5 μm. After the exposure, the development and the etching process are completed, the first organic material layer 1 having the first via holes H on a surface with regular pattern and shape can be obtained, the pore diameter of the first via hole H is 1 μm~3 μm.

S03, heating the first organic material layer 1, and melting the first organic material layer 1 to flow (as shown in FIG. 2(f)).

Herein, the heating method can adopt infrared heating, which can promote the melting of the organic material layer. The surface is changed from the original square structure with a corner to the curved surface profile. The heating temperature is equal to or slightly higher than the melting temperature of the organic layer material. In practice, the melt flow rate of the organic material structure and the profile of the formed curved surface can be controlled by controlling the heating temperature, and the pore diameter of the first via hole H of the organic material layer can be reduced to 3 μm or less.

The organic material is selected from plastic materials with lower melting temperature, such as polystyrene (PS), polyethylene terephthalate (PET), polyethylene (PE) or polypropylene (PP). Such material under 100° C.~150° C., melt flow may occur and the topography of which changes a certain amount. Therefore, the first organic material layer 1 after melting enables the pore diameter of the first via hole H to be naturally further reduced, breaking through the size limitation in the lithography process.

S04, wet-etching the surface of the transparent substrate 11 provided with the first organic material layer 1, and forming a recessed first microstructure 110 on a region of the transparent substrate 11 not shielded by the first organic material layer 1 (as shown in FIG. 2(g)).

Since the pore diameter of the first via hole H is able to be further reduced in the foregoing step, in this step, the pore diameter of the first microstructure 110 is correspondingly reduced, so that the completed cover glass can be applied to a display panel with a smaller pixel size and a higher resolution.

By wet-etching the surface of the transparent substrate 11, the pore diameter, depth, pore diameter and depth ratio, and other parameters of the first microstructures 110 formed on the transparent substrate 11 can be controlled by controlling the acid concentration, the wet etching rate and the wet etching time during actual fabrication, so as to obtain the appropriate technology patterns. For example, when the wet etching rate is slow, the wet etching time or acid concentration may be suitably increased.

S05, rinsing the transparent substrate 11 and removing the first organic material layer 1 form the surface of the transparent substrate 11 (as shown in FIG. 2 (h)).

In cleaning the organic material, an organic solvent may be used as the cleaning solution to obtain the transparent substrate 11 having the first microstructures 110 formed on the surface thereof.

Compared with the prior art, the first microstructure 110 on the surface of the transparent substrate 11 obtained by the above steps has a smaller pore diameter, the pore diameter of the first microstructure 110 can be 1 μm~3 μm, which breaking the size limit of the photolithography process.

Figure 3:
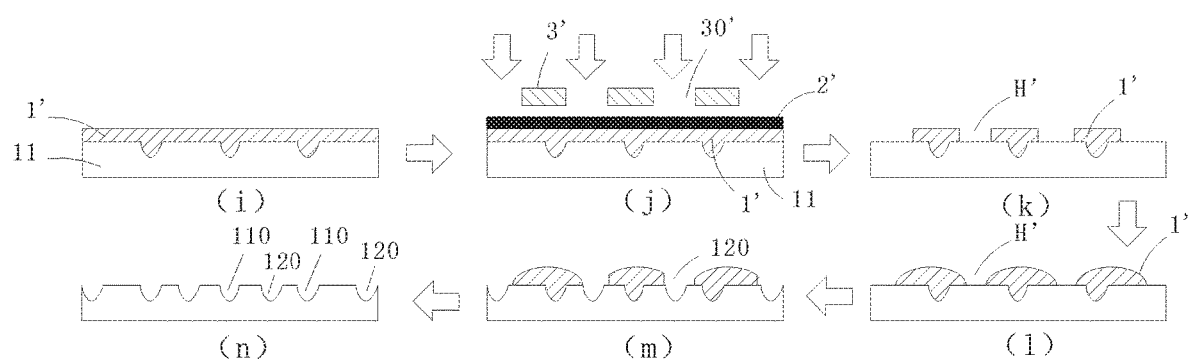
FIG. 3 is schematic diagram showing anther part of manufacturing method for a cover glass according to one embodiment of the present disclosure.

As shown in FIG. 1 and FIG. 3, in order to further increase the improvement to speckle phenomenon on the surface of the cover glass and make it suitable for a display panel with smaller sub-pixels, after the above steps are completed, the method may further include: S06; forming a recessed second microstructure 120 on the surface of the transparent substrate 10 having the first microstructure 110. The second microstructure 120 is offset from the first microstructure 110 by a certain distance.

The step of forming the second microstructure 120 specifically includes:

(1) coating a second organic material layer 1' on the surface of the transparent substrate 11 having the first microstructure 110 (as shown in FIG. 3(i));

(2) forming second via holes H' on the second organic material layer 1', a projection of the second via hole H' on the transparent substrate 11 being offset from the first microstructure 110 by a certain distance;

Herein, the step of forming the second via holes H' mainly comprises:

(2a) coating a second photoresist 2' on a surface of the second organic material layer 1', wherein the second photoresist layer 2' adopts a positive photoresist material;

(2b) disposing a second photomask 3' over the second photoresist layer 2', a second light-transmitting hole 30' provided on the second photomask 3', a projection of the second light-transmitting hole 30' on the transparent substrate 11 being offset from the first microstructure 110 (as shown in FIG. 3(j));

(2c) exposing the second photoresist layer 2' through the second light-transmitting hole 30', and then etching the organic material facing the second light-transmitting hole 30' after development to obtain the second organic material layer 1' with the second via hole H' provided on its surface (as shown in FIG. 3 (k)).

Herein, the shape and size of the second light-transmitting hole 30' is the same as that of the first light-transmitting hole 30, the size of the second via hole H' is the same as that of the first via hole H.

(3) heating the second organic material layer 1', and melting the second organic material layer 1' to flow, so as to reduce the pore diameter of the second via hole H' (as shown in FIG. 3 (l));

(4) wet-etching the surface of the transparent substrate 11 provided with the second organic material layer 1', and forming the second microstructure 120 on a region of the transparent substrate 11 not shielded by the second organic material layer 1' (as shown in FIG. 3 (m));

(5) rinsing the transparent substrate 11 and removing the second organic material layer 1' from the surface of the transparent substrate 11 (as shown in FIG. 3(n)). At this point, the production of the cover glass is completed.

After the second microstructure 120 is fabricated, the microstructures formed by the first microstructure 110 and the second microstructure 120 on the surface of the cover glass cover 90% to 95% of the cover glass. The width and height and width ratio of the microstructure can be achieved by controlling the melt flow rate of the organic layer, the wet etching acid concentration, the acid flow rate, and the etching time. The anti-glare microstructure made by such a process breaks through the size limit of the lithography process, with the increase of panel resolution, pixel size reduction, its practicality will gradually increase.

Figure 4:
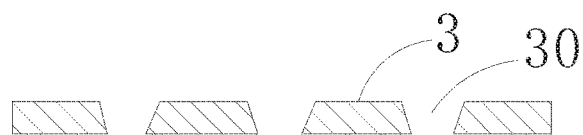
FIG. 4 is a cross-section schematic diagram of a first photomask according to one embodiment of the present disclosure.

Furthermore, as shown in FIG. 4, both the first via hole 30 in the first photomask 3 and the second via hole 30' in the second photomask 3' of the present embodiment can be made into horn-shaped holes. The closer to the first organic material layer 1, the smaller the pore diameter of the first light-transmitting hole 30 and the second light-transmitting hole 30 is. In this way, the pore diameters of the first via hole H and the second via hole H' can be reduced, and the first micro groove 110 and the second microstructure 120 can be made smaller, accordingly.

In summary, the present disclosure breaks through the limit of the microstructure prepared by the existing photolithography process, so that the microstructure size can be controlled below 5 μm, and the organic material in wet-etching process can be controlled by heating to make the organic material melted to flow. Such that, the size of the microstructure on the surface of the cover glass can be further reduced, the size of the microstructure of the cover glass can be flexibly adjusted according to the pixel size in the display panel. Therefore, to reduce the speckle effect on the image quality of the display device caused by the anti-glare treatment on the surface of the cover glass.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method of manufacturing a cover glass, comprising:
providing a transparent substrate, and coating a first organic material layer on a top surface of the transparent substrate;
forming first via holes on the first organic material layer at intervals;
heating the first organic material layer, and melting the first organic material layer to flow;
wet-etching the surface of the transparent substrate provided with the first organic material layer, and forming a recessed first microstructure on a region of the transparent substrate not shielded by the first organic material layer; and
rinsing the transparent substrate and removing the first organic material layer from the surface of the transparent substrate; and
forming a recessed second microstructure on the surface of the transparent substrate having the first microstructure, the second microstructure being offset from the first microstructure by a certain distance;
wherein the step of forming the second microstructure comprises:
coating a second organic material layer on the surface of the transparent substrate having the first microstructure;
forming second via holes on the second organic material layer at intervals, a projection of the second via hole on the transparent substrate being offset from the first microstructure by a certain distance;
heating the second organic material layer, and melting the second organic material layer to flow;

wet-etching the surface of the transparent substrate provided with the second organic material layer, and forming the second microstructure on a region of the transparent substrate not shielded by the second organic material layer; and rinsing the transparent substrate and removing the second organic material layer from the surface of the transparent substrate.

2. The method of manufacturing a cover glass according to claim 1, further comprising rinsing the transparent substrate before coating the first organic material layer on the top surface of the transparent substrate.

3. The method of manufacturing a cover glass according to claim 1, wherein forming first via holes on the first organic material layer at intervals comprises:

coating a first photoresist layer on a surface of the first organic material layer, the photoresist layer adopting a positive photoresist material; disposing a first photomask over the first photoresist layer, a first light-transmitting hole being provided on the first photomask;

exposing the first photoresist layer through the first light-transmitting hole, and then etching the organic material facing the first light-transmitting hole after development to obtain the first organic material layer with the first via hole provided on its surface.

4. The method of manufacturing a cover glass according to claim 3, wherein a pore diameter of the first light-transmitting hole is 1 μm~3~m, a pore diameter of the first via hole is 1 μm~5 μm.

5. The method of manufacturing a cover glass according to claim 4, wherein the first light-transmitting hole is a horn-shaped hole, and the more closer to the first organic material layer, the smaller the pore diameter of the first light-transmitting layer is.

6. The method of manufacturing a cover glass according to claim 1, wherein a material of the first organic material is polystyrene, polyethylene terephthalate, polyethylene or polypropylene.

7. The method of manufacturing a cover glass according to claim 1, wherein forming second via holes on the second organic material layer at intervals, comprises:

coating a second photoresist on a surface of the second organic material layer, the second photoresist layer adopting a positive photoresist material;

disposing a second photomask over the second photoresist layer, a second light-transmitting hole provided on the second photomask, a projection of the second light-transmitting hole on the transparent substrate being offset from the first microstructure; and exposing the second photoresist layer through the second light-transmitting hole, and then etching the organic material facing the second light-transmitting hole after development to obtain the second organic material layer with the second via hole provided on its surface.

\* \* \* \* \*